US006560120B2

United States Patent
Kurrer et al.

(10) Patent No.: US 6,560,120 B2
(45) Date of Patent: *May 6, 2003

(54) MODULAR SYSTEM FOR ELECTRICAL PRINTED CIRCUIT BOARDS WITH CENTERING CONTACTS ON FRONT ELEMENTS AND SEPARATE LOCATING CONTACTS, NOTABLY WITH CONTACT BLADES IN THE RACK ASSEMBLY

(75) Inventors: Siegfried Kurrer, Nuernberg (DE); Kurt-Michael Schaffer, Eckental (DE)

(73) Assignee: Rittal Electronics Systems GmbH & Co. KG, Herborn (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/851,381
(22) Filed: May 9, 2001
(65) Prior Publication Data

US 2002/0006034 A1 Jan. 17, 2002

Related U.S. Application Data

(63) Continuation of application No. PCT/DE99/03572, filed on Nov. 9, 1999.

(30) Foreign Application Priority Data

Nov. 9, 1998 (DE) .......................................... 198 51 516

(51) Int. Cl.[7] .............................. H05K 5/00; H05K 5/04
(52) U.S. Cl. ....................... 361/759; 361/740; 361/741; 361/797; 439/152; 439/64
(58) Field of Search ................................. 361/759, 740, 361/747, 828, 788, 797, 802, 801, 796, 726, 756, 752; 439/152, 64

(56) References Cited

U.S. PATENT DOCUMENTS

| | | | |
|---|---|---|---|
| 3,696,936 A | * | 10/1972 | Straccia et al. .......... 211/41.17 |
| 5,293,303 A | * | 3/1994 | Fletcher et al. ............. 361/798 |
| 6,266,253 B1 | * | 7/2001 | Kurrer et al. ............... 361/759 |

FOREIGN PATENT DOCUMENTS

| | | | |
|---|---|---|---|
| DE | 36 24 839 C2 | 1/1988 | |
| DE | 36 24 883 | 1/1988 | ............ H05K/7/14 |
| DE | 36 34 462 | 12/1988 | ............ H05K/7/14 |
| DE | 29509185.1 U1 | 8/1996 | |
| DE | 19755018 C1 * | 2/1999 | ............ H05K/7/14 |
| EP | 0 579 859 | 1/1994 | ............ H05K/7/14 |
| WO | WO 96/39013 | 12/1996 | |
| WO | WO 96/42187 | 12/1996 | |
| WO | WO 97/49271 | 12/1997 | |

* cited by examiner

*Primary Examiner*—David Martin
*Assistant Examiner*—Hung Bui
(74) *Attorney, Agent, or Firm*—Pauley Petersen Kinne & Erickson

(57) ABSTRACT

A rack assembly (1) includes cross-connecting bars (5) and guide bars (15) for printed circuit boards (59). These guide bars each include a fixing device (36) for the placement of a receiving element (17) which has a contact zone (37) and is placed into electric contact on a cross-connecting bar. The invention also provides for front elements (13) having centering contacts (25) that protrude into, and thereby come into contact with, the contact zone, in a low-ohmic, current-carrying manner, when the front element is set in place. The receiving element preferably has a contact blade (54) which extends into a guide groove (26) of the guide bar.

30 Claims, 6 Drawing Sheets

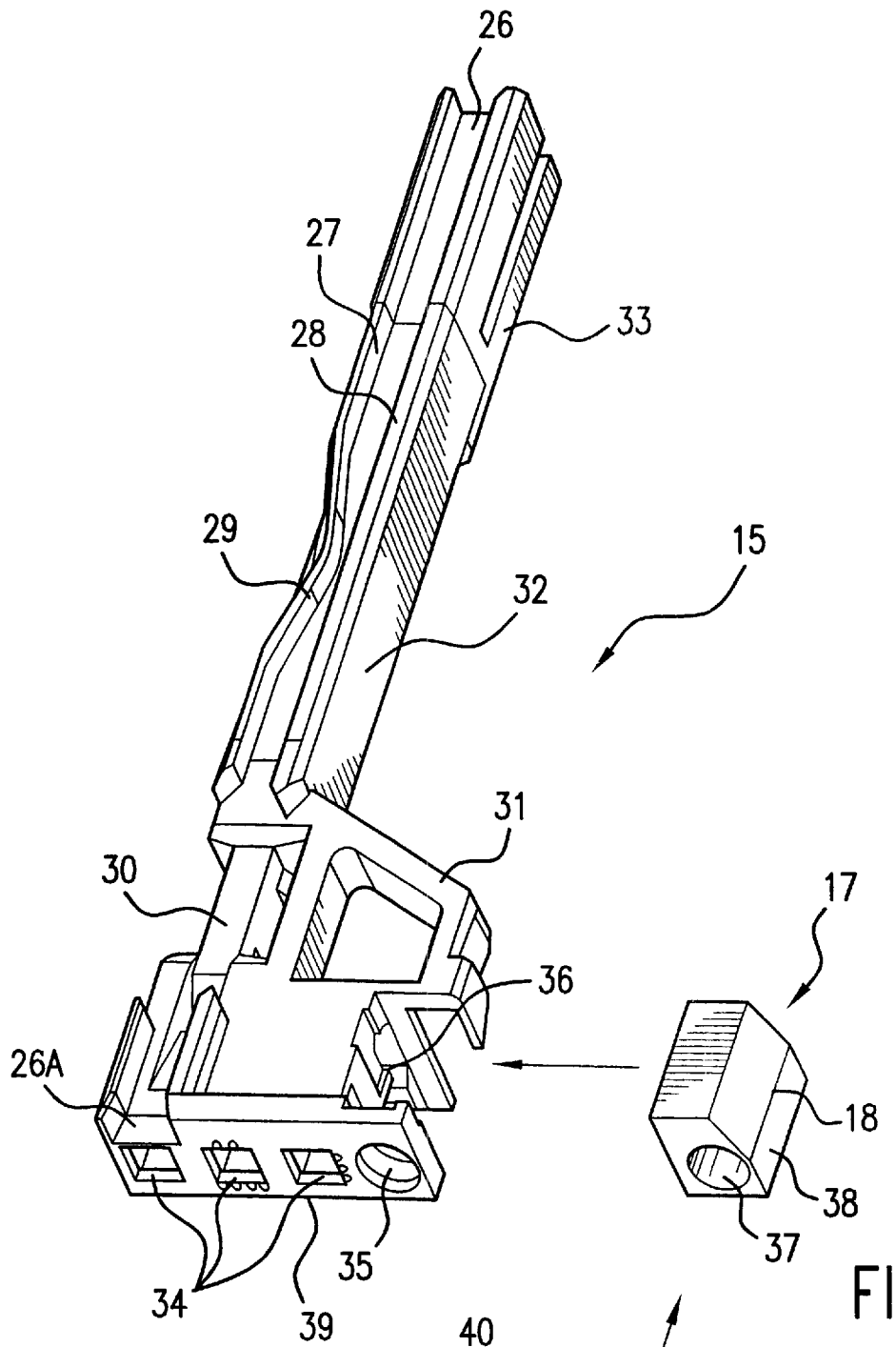
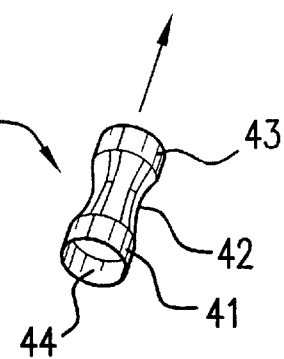
FIG. 2a  FIG. 2b  FIG. 2c

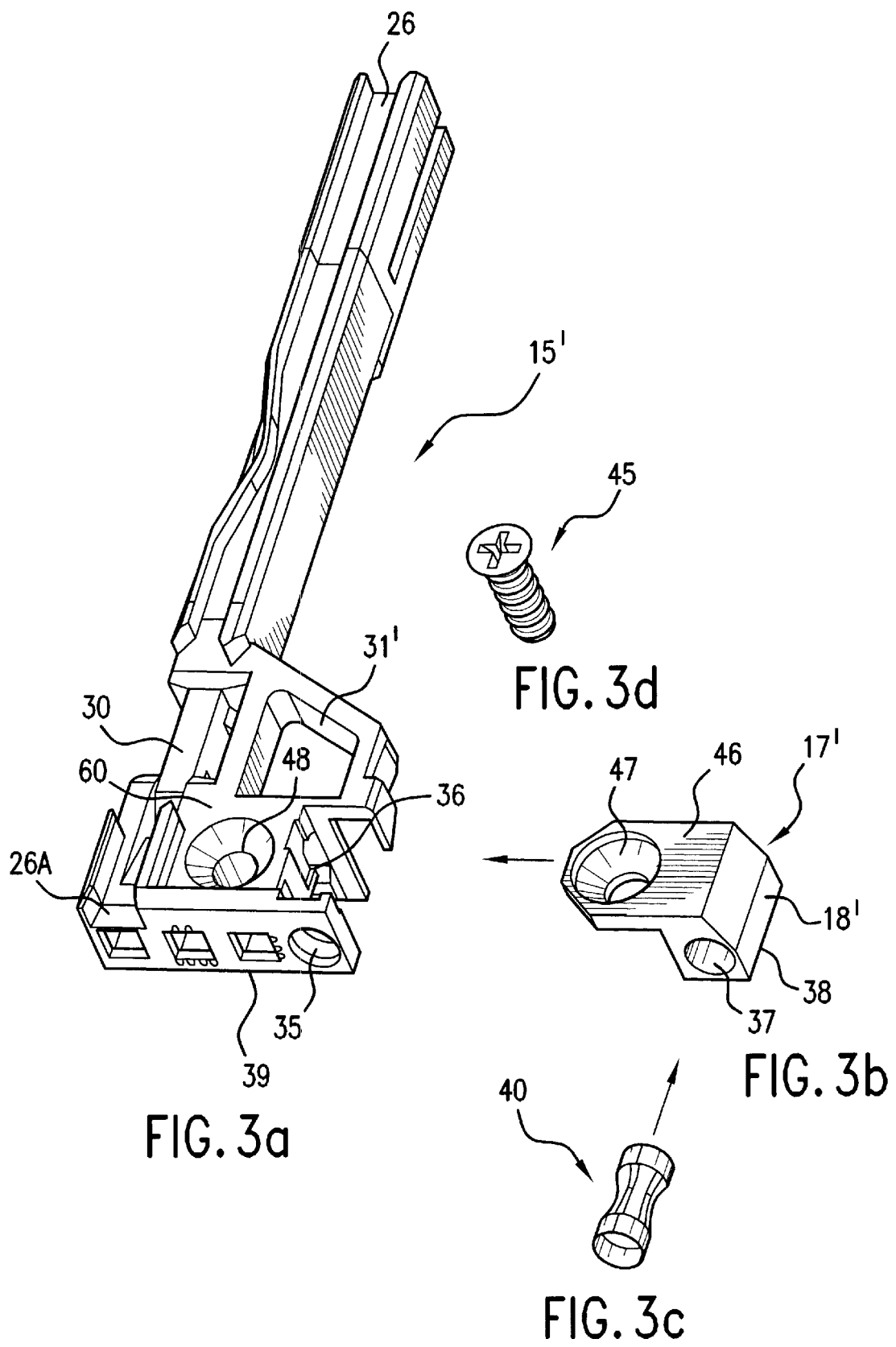

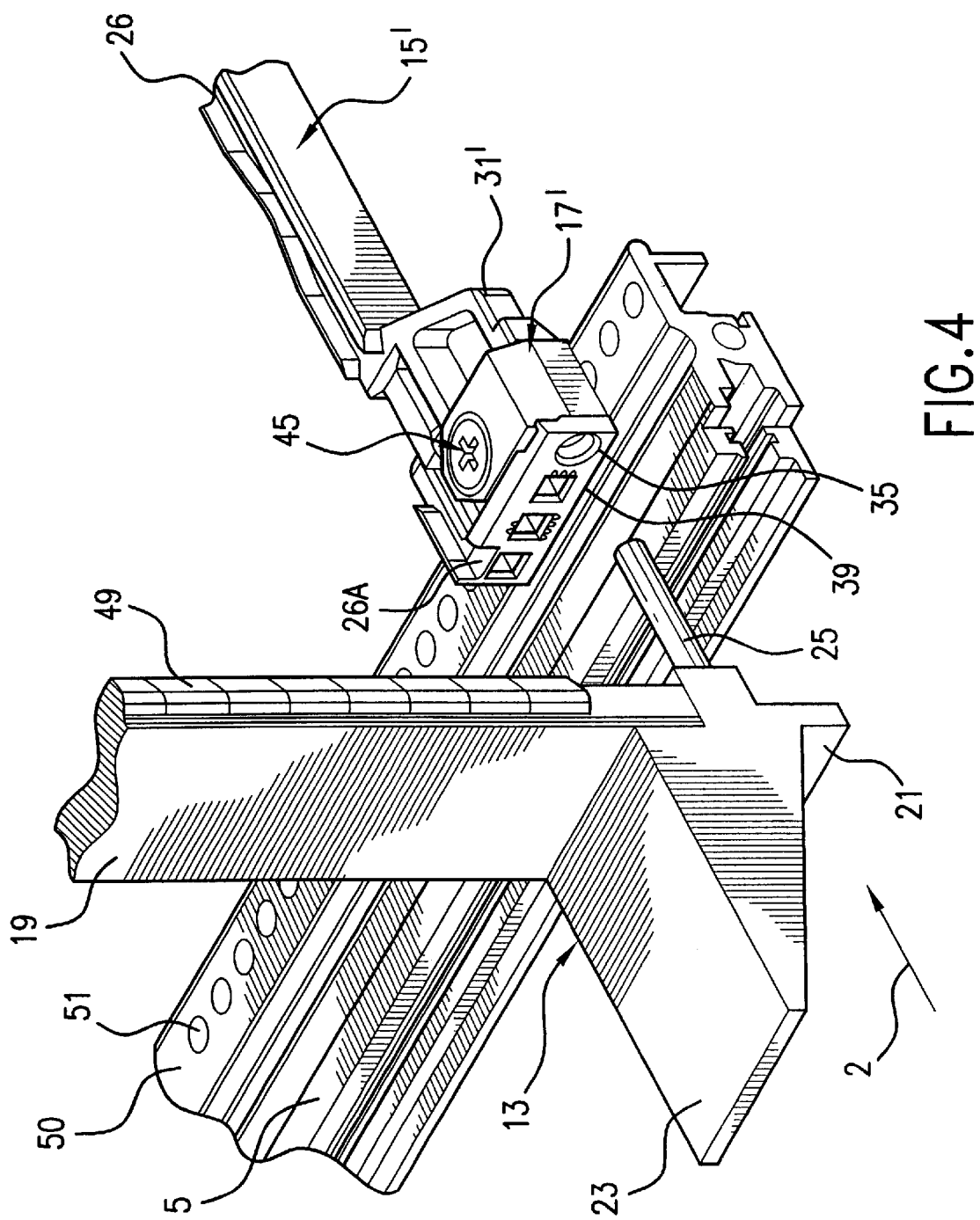

MODULAR SYSTEM FOR ELECTRICAL PRINTED CIRCUIT BOARDS WITH CENTERING CONTACTS ON FRONT ELEMENTS AND SEPARATE LOCATING CONTACTS, NOTABLY WITH CONTACT BLADES IN THE RACK ASSEMBLY

This is a Continuation of international Application PCT/DE99/03572, with an international filing date of Nov. 9, 1999, which was published under PCT Article 21(2) in German, and the complete disclosure of which is incorporated into this application by reference.

FIELD OF AND BACKGROUND OF THE INVENTION

The invention relates to modular systems that include a rack assembly for inserting electrical printed circuit boards. Such rack assemblies include at least opposite cross-connecting bars made of electrically conductive material, which are covered with guide bars situated opposite each other in pairs. Such rack assemblies thus provide volume elements suited for the insertion of electrical printed circuit boards. Such volume elements are also called mounting sites and are normally arranged parallel side by side. Electrical printed circuit boards can be inserted into such volume elements, which are then also arranged parallel side by side.

FIG. 1 shows one possible basic standard construction of a rack assembly 1. The area for receiving printed circuit boards is bordered by cross-connecting bars made of electrically conductive material situated opposite each other. In the example shown in FIG. 1, there are two lower cross-connecting bars 5,7 and two opposite, upper cross-connecting bars 4,6. The cross-connecting bars 4,5 form the boundaries of the front side of the rack assembly 1, i.e., the insertion side 2 provided for positioning electrical printed circuit boards. The two cross-connecting bars 6,7 form the boundaries of the rear wall side 3 of the rack assembly 1, which can be separated by a rear wall conductor plate. The cross-connecting bars 4,5,6,7 can be mounted by their ends, e.g., inside a control cabinet. In FIG. 1 there are vertical side wall metal plates 8,9, to which the cross-connecting bars are screwed at their ends. Lastly, the upper and lower sides of the rack assembly 1 are closed by an upper and a lower cover plate 10,11.

So-called front elements are provided for closing the insertion side 2 of the rack assembly 1. Such front elements are assigned to the individual mounting sites on the interior of the rack assembly, to whose width they are adjusted and to which they can be connected or disconnected. This possibility of closure can be independent of whether or not the mounting site located behind a front element contains an electrical printed circuit board. Thus, empty mounting sites can be covered with a front element placed on the insertion side 2 of the rack assembly 1, in the manner of an empty site cover. Alternatively, electrical printed circuit boards can be provided with a front element on the front side, so that, after the printed circuit board has been inserted into the rack assembly 1, the front element covers the corresponding mounting site on the insertion side 2 in the same manner.

In FIG. 1, front elements 12,13 are provided for the two mounting sites 56,57 on the left side of the rack assembly 1. These front elements are multisectional in design. Thus, the front element 13 contains a vertical face plate 19 made of an electrically conductive material. The lower and upper front faces of the face plate 19 are provided with an end piece 20,21, which usually also consists of an electrically conductive material. As an example, these end pieces can be provided with so-called rotary lever pulling handles 22,23. Such handles can be operated by a person through a pivot action so that a front element 12,13 can be easily attached or taken off, or an electrical printed circuit board connected to a front element can be easily inserted or removed.

In the example shown in FIG. 1, the front element 12 has already been pushed on and completely covers the mounting site 56 located behind it, and lies in the plane of the insertion side 2 of the rack assembly 1. In this example, the front element 13 of the mounting site 57 situated behind it is affixed to the printed circuit board 59. This connection is advantageously achieved with the help of the two end pieces 20,21. The printed circuit board has for the most part already been inserted into the mounting site 57. After complete insertion into the mounting site 57, the front element 13 will come to lie flush against the front element 12 in the plane of the insertion side 2.

Guide bars for guiding the printed circuit boards are advantageously arranged in opposite pairs for each mounting site in the mounting zone between the cross-connecting bars. In the example shown in FIG. 1, the entire mounting zone between the upper and lower cross-connecting bars 4,6 and 5,7, i.e., the sum of all mounting sites, is already provided with such pairs of guide bars. Thus, the printed circuit board 59 is guided on the upper and lower front side by the guide bars 14,15 situated opposite one another.

When inserting front elements or units made of front elements and electrical printed circuit boards, such elements should be centered in the insertion direction, particularly immediately before the final inserted position is achieved. This prevents an accidental lateral shift of, in particular, the front elements, which could at least hinder complete insertion thereof. This centering is especially necessary if adjoining mounting sites are already covered with front elements.

Finally, it is preferable to form a secure electrically conductive contact between the front elements and the rack assembly, particularly if the front elements and their components largely consist of electrically conductive materials. Electrically conductive contacts may be classified into the following different types.

One first type of contact can be described as a protective contact or ground contact. Through such a contact, high stray currents can be diverted from front elements to the rack assembly and then interrupted by downstream network protection devices, e.g., load separating switches or stray current line protection switches, at a speed ensuring the protection of persons. A protective contact should be especially effective if all the printed circuit boards in a rack assembly are electrically activated.

Another type of contact is used for diverting electrostatic voltage and can be described as an ESD (electro static discharge) contact. In this way, static potentials can be diverted from front elements to the rack assembly and its ground connection. An ESD contact should be especially effective when printed circuit boards are inserted into or removed from a rack assembly.

European patent 0 579 859 B1 describes a printed circuit board with guide pins for exact positioning during insertion into a rack assembly. In that patent, two guide pins are provided for centering a printed circuit board on the outsides of the corner assembly bodies. These guide pins support a longitudinal guide bar on the side flanks of the opposite head during insertion. In addition, a ground contact pin is arranged between the guide pins. This ground contact pin drops into an encoding chamber containing a ground contact spring on the front side of the opposite head of the longitudinal guide bar when the printed circuit board is inserted.

The reference WO 96/42187 describes a front system for a printed circuit board with an active/passive switch. For centering, the end piece of the printed circuit board is provided with a guide pin designed to enter into a corresponding guide bore. In that reference, no elements are provided for producing a protective electrical contact between the front element and the cross-connecting bars.

The reference WO 97/49271 describes a rack assembly for electrical printed circuit boards. The printed circuit boards are provided on one longitudinal side with a contact strip designed as a conductor track, which is interconnected to a metallic face plate of the printed circuit board via an electric resistor.

When the printed circuit board is inserted into the rack assembly, the contact strip comes into an electrically conductive contact loop with a contact spring, which is integrated in a guide bar, particularly at the head area, and is connected to the corresponding cross-connecting bars in an electrically conductive manner. The face plate of the printed circuit board is also provided with a screw, through which a direct electrically conductive connection to the rack assembly is produced once the circuit board is in the inserted state, while circumventing the resistor. Implementations of guide bars with loop contact springs are known, e.g., from DE 36 24 883 and DE GM 295 09 185.

Lastly, DE 36 24 839 C2 describes a guide bar for printed circuit boards. Its guide groove is bordered by side walls, whereby one side wall is separated from the groove base in a section thereof, and is designed as a bell curve shaped plate spring in such a way that the width of the guide groove is tapered.

OBJECTS OF THE INVENTION

One object of the present invention is to provide a modular system with a rack assembly for inserting electrical printed circuit boards, which enables the simple subsequent installation of contact parts for protective contacts of front elements. Another object of the present invention is to provide an especially simple integration as well as simple subsequent installation of devices for redirecting static voltage potentials.

SUMMARY OF THE INVENTION

According to one formulation of the invention, these and other objects are solved by a modular system for electrical printed circuit boards having a rack assembly and electrically conductive front elements. The rack assembly is provided with mounting sites for insertion of the electrical printed circuit boards on a module side of the rack assembly, and includes opposite cross-connecting bars made of electrically conductive material, and guide bars for insertion of the printed circuit boards into the mounting sites. The guide bars are affixed to the cross-connecting bars and include fixing devices for insertion of locating contacts made of electrically conductive material, which are placed into low-ohmic contact on the cross-connecting bars and have respective contact zones. The electrically conductive front elements are each assigned to at least one of the mounting sites and each have at least one centering contact protruding in a direction of the module side of the rack assembly. When the front element is placed on the at least one mounting site, it comes into low-ohmic and high current-carrying contact with the contact zone of at least one of the locating contacts.

According to a further formulation of the invention, the modular system for electrical printed circuit boards includes, again, a rack assembly and electrically conductive front elements. The rack assembly is provided with mounting sites for insertion of the electrical printed circuit boards on a module side of the rack assembly. The rack assembly includes (i) opposite cross-connecting bars made of electrically conductive material, (ii) guide bars for insertion of the printed circuit boards into the mounting sites, wherein the guide bars include respective guide grooves and are affixed to the cross-connecting bars, and (iii) locating contacts made of electrically conductive material. These locating contacts are respectively assigned to the mounting sites, are placed into low-ohmic contact on said cross-connecting bars, have respective contact zones, and include respective contact blades that respectively extend into the guide grooves of the guide bars. Each of the electrically conductive front elements for the printed circuit boards include at least one centering contact protruding in a direction of the module side of the rack assembly. Upon insertion of the printed circuit board into the respective mounting site, the centering contact comes into low-ohmic, high current-carrying contact with the contact zone of a respective one of the locating contacts of the respective mounting site. In addition, the contact blades of the locating contacts respectively come into contact with the printed circuit boards to draw off electrostatic potentials.

According to yet another formulation, the invention provides a rack assembly including a guide bar, a receiving element and a front element. The guide bar supports a printed circuit board within the rack assembly. The receiving element is mounted to the guide bar, is composed of a different material than the guide bar, and has a contact cavity. The front element is fastened to the printed circuit board and includes a contact pin configured to mate with the contact cavity.

BRIEF DESCRIPTION OF THE DRAWINGS

The invention and further advantageous refinements of the invention according to the features of the dependent claims are explained in more detail below with the aid of diagrammatic, exemplary embodiments in the drawing, in which:

FIGS. 2a, 2b, 2c show a perspective top view of a first preferred embodiment of a guide bar and locating contact with a means of producing a ground contact in accordance with the invention, FIGS. 3a, 3b, 3c, 3d show a perspective top view of a second preferred embodiment of a guide bar and locating contact like those shown in FIG. 2, with a contact means and provided with an additional means for connection to the cross-connecting bars, FIG. 4 shows a perspective top view of a section of a front element, a cross-connecting bar and a guide bar into which a locating contact has been inserted in accordance with FIGS. 3a, 3b, 3c, 3d.

DETAILED DESCRIPTION OF THE PREFERRED EMBODIMENTS

Figure 1:
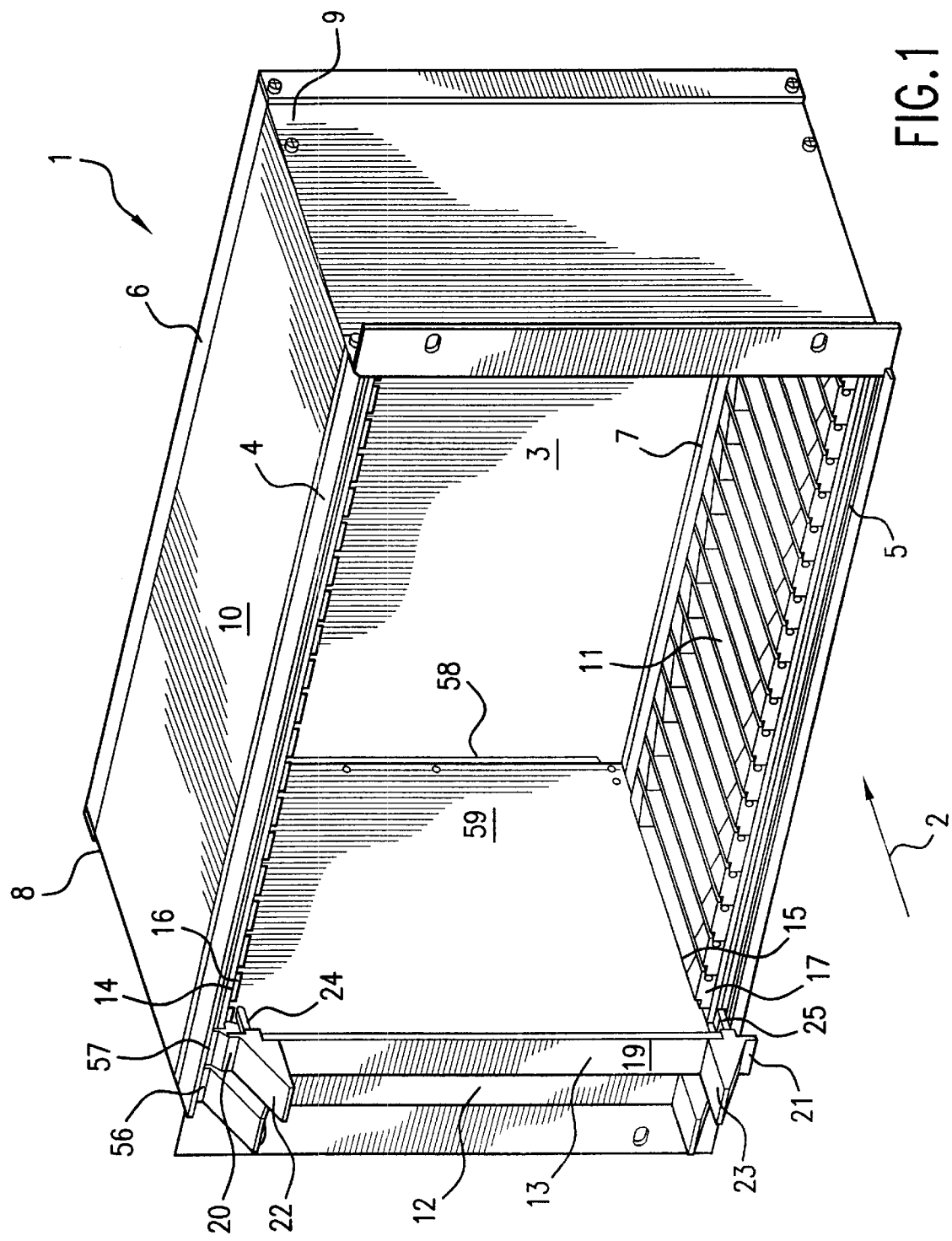
FIG. 1 shows a perspective lateral view of a modular system with a rack assembly and front elements, which was described in detail above.

In FIG. 1, which was already described in detail above, the front element 13 on the mounting site 57, which as an example is connected to the printed circuit board 59, is already provided with a centering contact 24,25 extending towards the insertion side 2 of the rack assembly 1 in accordance with the present invention. These centering contacts are each respectively attached to upper and lower end pieces 20,21, whereby the end pieces 20,21 are affixed to the front sides of the face plate 19 of the front element 13. The end pieces are also used for mounting upper and lower lever pulling handles 22,23, which enable the simple insertion or removal of the unit made up of the front element 13 and printed circuit board 58. Like the face plate and cross-connecting bars, the end pieces with the centering contacts also consist of electrically conductive material. The upper and lower cross-connecting bars 4,6 and 5,7 are provided with guide bars on the inner sides, which face the intermediately situated mounting sites. Here, each mounting site is provided with a pair of guide bars situated opposite one another, into which the edges of an intermediate printed circuit board can be guided. In the example shown in FIG. 1, guide bars 14,15 are assigned to mounting site 57.

According to the present invention, each guide rail is provided with at least one locating contact, which in turn is assigned to a centering contact on the corresponding front element. In FIG. 1, the locating contacts 16,17 are placed in the guide bars 14,15 and assigned to the centering contacts 24,25 on the front element 13. When the printed circuit board 59 is inserted into the mounting site 57 and as a result the front element 13 is placed on the insertion side 2 of the rack assembly 1, the centering contacts 24,25 on the front element 13 come into an electric, low-ohmic and high current-carrying contact with the locating contacts 16,17 on the guide bars 14,15. This produces a protective contact between the front element 13, printed circuit board 59 and rack assembly 1.

Due to the two-piece, separate design of the guide bars and the locating contacts, the present invention has the advantage under certain circumstances that guide bars that are already situated in a rack assembly can later be provided with locating contacts. One particular advantage is also that the guide bars and locating contacts can consist of different materials. Thus, the guide bars can be inexpensively manufactured from electrically non-conductive material, e.g., plastic, while at least the surface of the drop-in locating contacts consist of an electrically conductive material, particularly a metal.

A first exemplary embodiment of the present invention is described in detail below with the aid of FIGS. 2a, 2b and 2c. FIG. 2a shows a perspective top view of the head area of a guide rail, FIG. 2b shows a locating contact and FIG. 2c shows an advantageous, additional means of contact for insertion into the locating contact.

The guide bars 15, segments of which are shown in FIG. 2a, have a head area 31, to which a bar-shaped extension area 32 is attached. On their upper ends is a guide groove 26 for receiving the edge of a printed circuit board. This edge can be inserted via a funnel-shaped insertion area 26A at the front 39 of the head area 31 in the guide groove 25, which is bordered by a left, right groove wall 27,28. In the example shown in FIG. 2, one segment of the groove wall 27 is separated from the groove base and designed as a pressed-in spring area 29. Such an arrangement is described in DE 36 24 839. In addition, there is a break in groove walls 27,28 and in the groove base in the area 30. A flexible ESD contact can be inserted here, such as those described in DE 3624883 or DE GM 295 09 185. Finally, in the example shown in FIG. 2, the extension area 32 merges into a separate, and under certain circumstances multi-sectional extension 33, which can be attached to the extension area 32. Such a design is described in WO 96/39013. In addition, at the front 39 of the head area 31, below the insertion area 26A, there are encoding chambers 34 for the insertion of encoding pins.

Advantageously, each guide bar is provided with at least one fixing device for the insertion of a locating contact 17 made of electrically conductive material. Such a fixing device is preferably designed as a trough-shaped locating chamber 36, and is preferably arranged in the head area 31 of the guide bars and in spatial proximity to the insertion side 2 of the rack assembly 1. The locating contact can be placed into low-ohmic contact on the cross-connecting bars and is also provided with a contact zone, which serves to come into contact with a preferably pin-shaped centering contact on a front element. In accordance with another embodiment not specifically shown here, the fixing device can be provided with notch springs, which extend from the head area of the guide bars and clasp onto the flanks of a locating contact.

The contact zone can preferably be implemented in the form of a contact cavity integrated into the locating contact. For simplicity's sake, the term contact cavity will be used for the term contact zone in the following explanation. Of course, the contact zone or area can also be of a constructively different design.

In the embodiment shown in FIG. 2, the locating chamber 36 is also bordered by one area of the front face 39 of the head area 31. In order for a centering contact to be able to extend down into the locating chamber 36 and into any locating contact 17 that may be inserted there, the front face 39 is also provided with a locating opening 35 for a centering contact. The advantage of this design is that at least a centering effect is achieved when a centering contact enters the locating opening 35, even if no locating contact 17 has been inserted in the locating chamber 36.

FIG. 2b shows a first embodiment of a locating contact 17. This contact, symbolized here by an arrow, can be inserted into locating chamber 36. This contact can be designed as a block-shaped contact body 18, which on its underside, not shown here, is provided with a means of contact 38 for producing a low-ohmic contact with a cross-connecting bar, especially a clamp pin, and on the front is provided with a contact cavity 37 for receiving a preferably pin-shaped centering contact. In the inserted state, the opening of the contact cavity 37 corresponds to the locating opening 35 in the head area 31 of the guide bar 15.

FIG. 2c shows an advantageous implementation for an additional means of contact 40 between a locating contact and a centering contact. This can advantageously be designed as a cage spring or cylinder spring, which can be integrated into the contact cavity 37 of the locating contact 17. The cage spring 40 is preferably provided with a front, slotted, cylindrical hull 41 and a rear, slotted, cylindrical hull 43, which are connected by inwardly bent spring contact guard plates 42. These hulls create a narrowed contact channel, which in an electrically conductive manner lies atop a centering contact extending down into the means of contact 40 through the front guide area 44 in the hull 41.

A second embodiment is explained in more detail below with the aid of FIGS. 3a, 3b, 3c and 3d. As in FIG. 2a, FIG. 3a shows a perspective top view of the head area of a guide bar, FIG. 3b a locating contact and FIG. 3c an additional advantageous means of contact for insertion in the locating contact, analogous to the one shown in FIG. 2c. Finally, FIG. 3d shows an additional means of connecting the locating contact to a cross-connecting bar.

In comparison to the locating contact in FIG. 2b, the locating contact 17' shown in FIG. 3b has an additional fastening bracket 46 on the block-shaped contact body 18'. Said bracket is provided with a reach-through opening 47 for a fastener 45, which is shown in FIG. 3d as a screw. The fastener 45 serves to permanently fasten the locating contact 17' to the cross-connecting bars. At the same time, this produces an electrically low-ohmic, high current-carrying contact that is especially favorable in terms of meeting the requirements for protective contact.

It is especially advantageous if the head area 31' of the guide bar 15' is arranged as shown in FIG. 3a. In particular, the bracket 46 of a locating contact 17' inserted in the locating trough 36 lies on top of the upper surface 60 of the head area 31'. The fastener 45 passes through the reach-through opening 47 of the bracket 46 as well as through the corresponding reach-through opening 48 in the head area 31', down to a cross-connecting bar situated below. This ensures an extremely compact mounting of the guide bar and locating contact on a cross-connecting bar.

Such an arrangement is shown in the mounted state in FIG. 4. The lower guide bar 15' is laid on the upper surface 50 of a front, lower cross-connecting bar 5, a section of which is shown here, in the area of its preferably enlarged head area 31' and is preferably coupled onto the cross-connecting bar 5 via mounting holes 51.

A locating contact 17' is inserted into the head area 31' of the guide bar 15' in the manner described above. A screw 45, serving as a connector, passes through the locating contact 17' as well as through the head area 31' of the guide bar 15 and is screwed into a mounting hole 51 in the cross-connecting bar 5.

In addition, FIG. 4 shows a cross-section of the front element 13 for the mounting site 57, which for the sake of a better overview is not equipped with an electrical printed circuit board here. One longitudinal side of the front element is provided with an additional flexible contact strip 49. The front element 13 contains a face plate 19 of an electrically conductive material, on whose lower end is found a lower end piece 21 with a lower lever pulling handle 23 and a lower centering contact 25. When the front element 13 is placed on the insertion side 2 of the rack assembly, the end piece corresponds to the locating contact 17' in such a manner that it extends down into the locating opening 35 to the contact cavity 37. This produces both a ground contact of the front element 13 and of any printed circuit board interconnected therewith, as well as a mechanical mechanism for centering during the insertion process.

Figure 5:
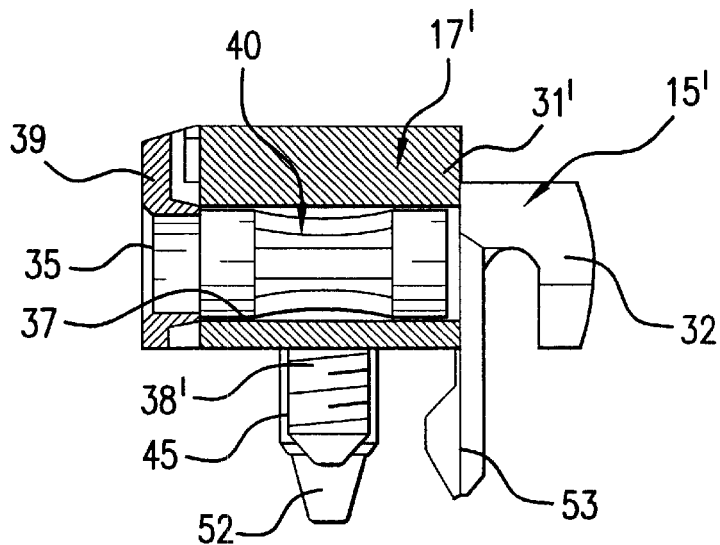
FIG. 5 shows a cross-section through a locating contact with a means of contact according to FIGS. 3b, 3c.

FIG. 5 shows a cross-section of a locating contact 17', situated in the head area 31' of the guide bar 15', with an inserted contact element 40. The embodiment corresponds to the examples shown in FIGS. 3a, 3b, 3c, 3d and 4. Below the head area 31', the guide bar 15' is provided with at least one grip knob 52, which extends into a mounting hole 51 on a cross-connecting bar. Furthermore, below the transition between the head area 31' and the extension area 32 of the guide bar 15' there is a notch handle 53, which serves to grip the rear of an edge of the cross-connecting bar. Moreover, FIG. 5 shows the thread of a screw 45 that simultaneously serves as a fastener for locating contact 17' and for the head area 31' of the guide bar. Finally, the cross-section shows a cylinder spring 40 placed in the contact cavity of the locating contact 17'. Specifically, the cylinder spring 40 is placed between the locating contact 17' and a centering contact, to provide additional contact. The underside of the locating contact 17' is provided with an additional means of contact 38', preferably in the form of a peg, which also locks into a mounting hole 51 on the cross-connecting bar. Finally, from the cross-section shown in FIG. 5 it is clear that the locating opening 35 on the front 39 of the head area 31' fits exactly into the opening of the contact cavity 37 in the locating contact 17' situated behind it.

Figure 6:
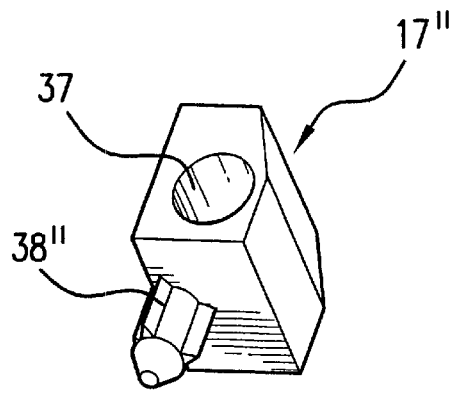
FIG. 6 shows a perspective lateral view of another embodiment of a locating contact.
Figure 7:
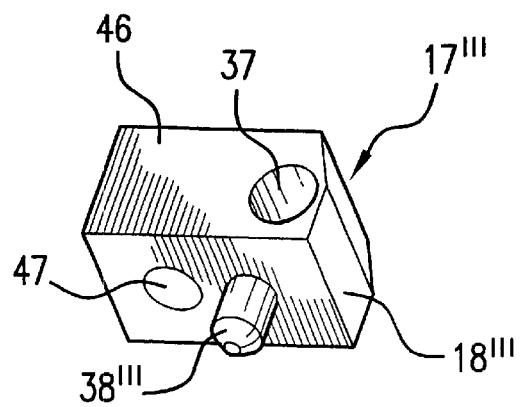
FIG. 7 shows a perspective lateral view of yet another embodiment of a locating contact.

FIG. 6 shows a perspective lateral view of another implementation of a locating contact 17", in which the means of contact 38" has additional barbs or blade edges on the underside. This improves the electric contact between the locating contact and a cross-connecting bar in a mounting hole 51. FIG. 7 shows another perspective lateral view of another implementation of a locating contact 17''', in which the contact body 18''' is provided with both a contact cavity 37 and a reach-through opening 47 as fasteners.

Figures 8A, 8B:
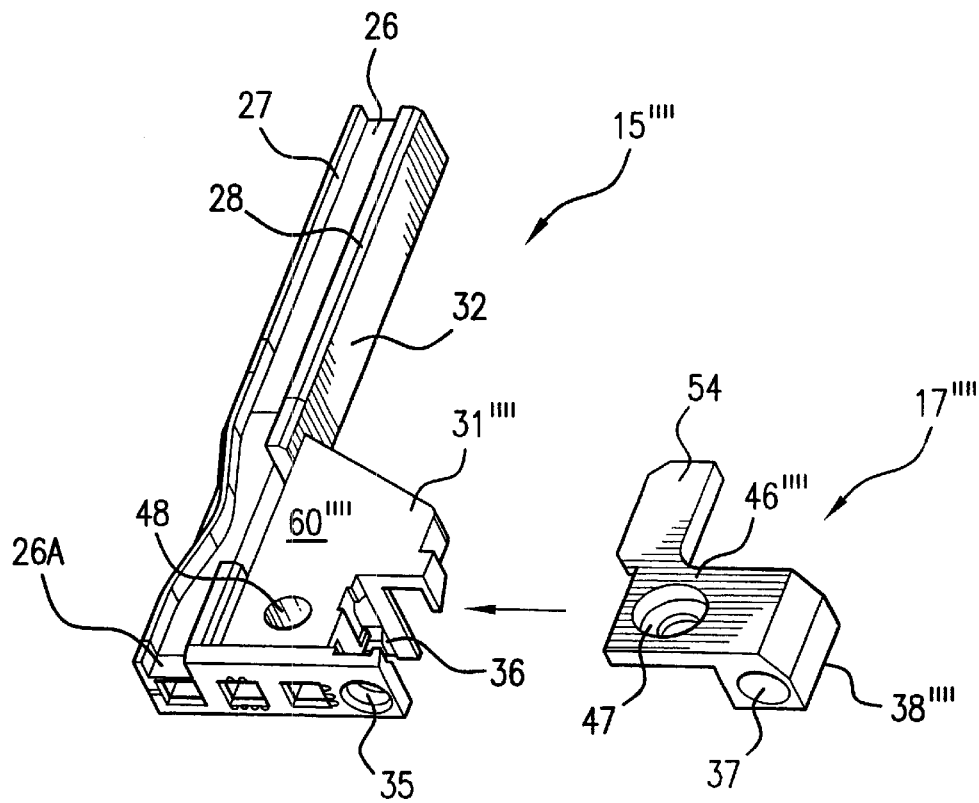
FIGS. 8a, 8b show a perspective top view of an exemplary guide bar and a locating contact, which, according to another embodiment of the present invention, are also provided with a contact blade for an ESD contact.

FIGS. 8a, 8b show perspective top views of other embodiments of a guide bar 15"" and a locating contact 17"". As far as these embodiments correspond to those shown in FIGS. 3a, 3b, 3c, 3d and 4, reference is made to the corresponding explanations above. However, the embodiment of the locating contact 17"" shown in FIG. 8b is also provided with a contact blade 54 in accordance with the present invention. In the example of FIG. 8b, this contact blade is preferably designed as one piece connected to the fastening bracket 46"" extending in the direction of the guide groove 26 on the guide bar. In another embodiment not shown here, said contact blade can also be a separate part that is mechanically interconnected to the locating contact 17"".

Figure 9:
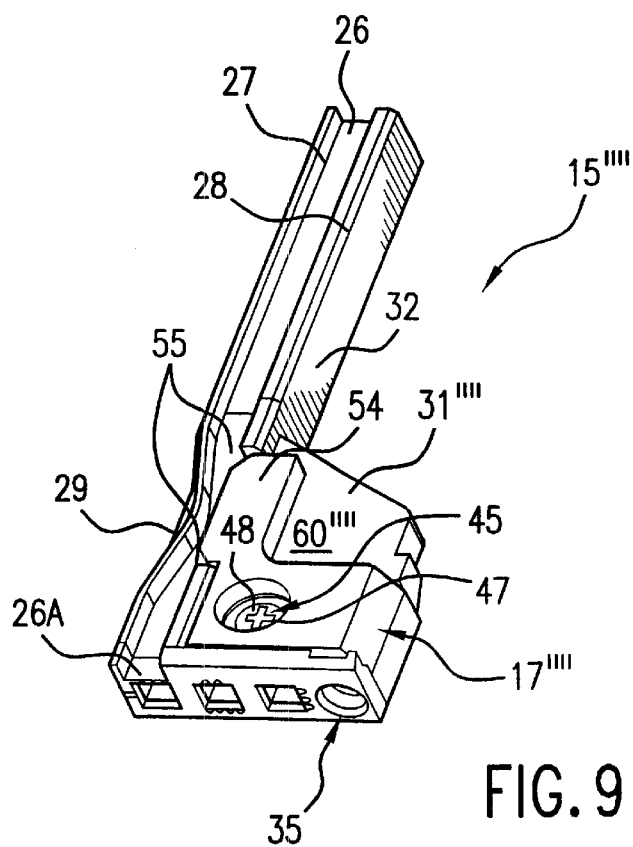
FIG. 9 shows a perspective top view of a guide bar with a locating contact inserted, in accordance with FIGS. 8a, 8b.

In the locating contact 17"" shown in FIG. 9 in its inserted position in the locating chamber 36, the contact blade 54 lies on the upper surface 60"" of the head piece 31"" of the guide bar 15"" and extends down into its guide groove 26. Advantageously, the right groove wall 28 has a break 55. If a printed circuit board is then inserted into the guide groove 26, the printed circuit board produces a type of ESD contact via the contact blade 54 of the locating contact 17"" with a cross-connecting bar, the rack assembly and its ground contact means. The connection is preferably achieved through a conductor track on the edge of the printed circuit board, which, especially during the insertion or removal process, comes into scraping contact with the contact blade. This allows electrostatic potentials, especially from a front element 13 of the printed circuit board, to be diverted. The particular advantage of the embodiments of the present invention shown in FIGS. 8a, 8b and 9 is that, with help of a single locating contact inserted into a guide bar, a ground as well as an ESD contact can be achieved between the front elements and the rack assemblies of the modular system. Separate scraping contact springs in the base of the groove of the guide groove in accordance with the systems described in references DE 3624883 and DE GM 295 09 185 are thus eliminated.

Advantageously, one of the groove walls of a guide groove (as shown in the examples in FIGS. 8a, 9 the left groove wall 27 of the guide groove 26 on the guide bar 15) is separated from the base of the groove in one area 55 situated opposite the contact blade 54. This section of the groove wall is designed as a bell curve shaped plate spring so that the width of the guide groove 26 is tapered in the area where the contact blade 54 intervenes. Thus the edge of a printed circuit board can be pressed onto the contact blade and, by way of example, a conductor track situated on the printed circuit board is brought into scraping contact with the contact blade. Furthermore, in the embodiment shown in FIGS. 8a, 8b, an additional means of connection can also be provided, preferably in the form of a screw, through which the locating contact 17"" along with the contact blade 54, as well as the guide bar 15"", particularly via the head area 31"", can be mechanically and electrically connected to a cross-connecting bar situated under it. In the mounted position, shown in FIG. 9, such a coupling screw is placed in the reach-though openings 47 and 48 of the locating contact and the guide bar 15"".

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. Modular system for electrical printed circuit boards, comprising:
    a rack assembly with mounting sites for insertion of the electrical printed circuit boards on a module side of said rack assembly, comprising:
        opposite cross-connecting bars made of electrically conductive material, and
        guide bars for insertion of the printed circuit boards into the mounting sites, wherein said guide bars are affixed to said cross-connecting bars and comprise fixing devices for insertion of
        locating contacts made of electrically conductive material, which are placed into low-ohmic contact on said cross-connecting bars and have respective contact zones; and
    electrically conductive front elements, each of which is assigned to at least one of the mounting sites and has at least one centering contact protruding in a direction of the module side of the rack assembly, wherein, when said front element is placed on the at least one mounting site, said centering contact comes into low-ohmic and high current-carrying contact with the contact zone of at least one of said locating contacts.

2. Modular system in accordance with claim 1, wherein said fixing devices of said guide bars are configured as trough-shaped locating chambers.

3. Modular system in accordance with claim 1, wherein said guide bars have respective locating openings configured to receive a respective one of said centering contacts, wherein the locating openings respectively extend from front sides, facing away from the module side of the assembly rack, of said guide bars and merge into said fixing devices.

4. Modular system in accordance with claim 1, further comprising additional fasteners configured to electrically low-ohmically fasten, respectively, said locating contacts to said cross-connecting bars.

5. Modular system in accordance with claim 4, wherein said additional fasteners respectively comprise a bolted joint.

6. Modular system in accordance with claim 4, wherein said additional fasteners are further configured to fasten, respectively, said guide bars to said cross-connecting bars.

7. Modular system in accordance with claim 6, wherein said guide bars have respective reach-through openings configured for said additional fasteners to extend down to said cross-connecting bars.

8. Modular system in accordance with claim 4, wherein said locating contacts respectively comprise:
    a contact body having the contact zone for said centering contact of said front element; and
    a bracket configured for a respective one of said additional fasteners to extend through.

9. Modular system in accordance with claim 8, wherein said guide bars respectively comprise a widened head area that lies on a respective one of said cross-connecting bars and into which said fixing devices are respectively integrated,
    wherein said brackets of said locating contacts respectively lie on upper side of said head areas, and
    wherein said additional fasteners respectively extend through said brackets and the head areas down to said cross-connecting bars.

10. Modular system in accordance with claim 1, wherein said guide bars respectively comprise a widened head area that lies on a respective one of said cross-connecting bars and into which said fixing devices are respectively integrated.

11. Modular system in accordance with claim 1, further comprising additional contact pieces respectively mounted between said locating contacts and said centering contacts.

12. Modular system in accordance with claim 11, wherein said additional contact pieces comprise respective cage springs integrated into said locating contacts.

13. Modular system in accordance with claim 1, wherein said locating contacts comprise respective contact blades, which respectively extend into guide grooves on said guide bars and contact the printed circuit boards, for diverting electrostatic potentials.

14. Modular system in accordance with claim 1, wherein said guide bars are produced from an-electrically non-conductive material.

15. Modular system for electrical printed circuit boards, comprising:
    a rack assembly with mounting sites for insertion of the electrical printed circuit boards on a module side of said rack assembly, comprising:
        opposite cross-connecting bars made of electrically conductive material,
        guide bars for insertion of the printed circuit boards into the mounting sites, said guide bars comprising respective guide grooves and being affixed to said cross-connecting bars, and
        locating contacts made of electrically conductive material, which are respectively assigned to the mounting sites, which are placed into low-ohmic contact on said cross-connecting bars, which have respective contact zones, and which further comprise respective contact blades that respectively extend into said guide grooves of said guide bars; and
    electrically conductive front elements for the printed circuit boards, each of said front elements comprising at least one centering contact protruding in a direction of the module side of the rack assembly, wherein, upon insertion of the printed circuit board into the respective mounting site:
        said centering contact comes into low-ohmic, high current-carrying contact with the contact zone of a respective one of said locating contacts of the respective mounting site, and said contact blades of said locating contacts respectively come into contact with the printed circuit boards to draw off electrostatic potentials.

16. Modular system in accordance with claim 15, wherein said guide bars comprise respective fixing devices for insertion of said locating contacts, respectively.

17. Modular system in accordance with claim 16, wherein said fixing devices are configured as trough-shaped locating chambers.

18. Modular system in accordance with claim 16, further comprising additional fasteners configured to electrically low-ohmically fasten, respectively, said locating contacts to said cross-connecting bars.

19. Modular system in accordance with claim 18, wherein said additional fasteners respectively comprise a bolted joint.

20. Modular system in accordance with claim 18, wherein said additional fasteners are further configured to fasten, respectively, said guide bars to said cross-connecting bars.

21. Modular system in accordance with claim 18, wherein said locating contacts respectively comprise:
   a contact body having the contact zone for said centering contact of said front element; and
   a bracket configured for a respective one of said additional fasteners to extend through.

22. Modular system in accordance with claim 21, wherein said contact blades are respectively interconnected as one piece with said brackets of said locating contacts.

23. Modular system according to claim 15, wherein said guide grooves of said guide bars comprise respective bases bordered by groove walls,
   wherein one of said groove walls situated opposite a respective one of said contact blades is separated, in a section of said groove wall, from said base of said guide groove, and
   wherein said one groove wall is configured as a bell-curve-shaped plate spring that tapers a width of said guide groove in a vicinity of said one contact blade.

24. Modular system in accordance with claim 15, wherein said guide bars are produced from an electrically non-conductive material.

25. A rack assembly comprising:
   a cross-connecting bar forming a structural part of a frame for the rack assembly;
   a guide bar that supports a printed circuit board within the rack assembly and is supported by said cross-connecting bar;
   a receiving element, which is mounted to said guide bar, which is composed of a different material than said guide bar, and which has a contact cavity, said receiving element comprising a contact blade that contacts the printed circuit board; and
   a front element fastened to the printed circuit board and comprising a contact pin configured to mate with the contact cavity.

26. The rack assembly of claim 25, wherein said guide bar is of electrically non-conductive material and said receiving element is of electrically conductive material.

27. The rack assembly of claim 25, further comprising: a fastening element that fastens said receiving element to said cross-connecting bar.

28. The rack assembly of claim 27, wherein said guide bar is of electrically non-conductive material, and wherein said receiving element, said fastening element and said cross-connecting bar are of electrically conductive material.

29. The rack assembly of claim 27, wherein said fastening element additionally fastens said guide bar to said cross-connecting bar.

30. The rack assembly of claim 25, wherein said guide bar is of electrically non-conductive material and said receiving element is of electrically conductive material.

* * * * *